US010364144B2

(12) United States Patent
Herbsommer et al.

(10) Patent No.: US 10,364,144 B2
(45) Date of Patent: Jul. 30, 2019

(54) HERMETICALLY SEALED PACKAGE FOR MM-WAVE MOLECULAR SPECTROSCOPY CELL

(71) Applicant: Texas Instruments Incorporated, Dallas, TX (US)

(72) Inventors: Juan Alejandro Herbsommer, Allen, TX (US); Adam Joseph Fruehling, Dallas, TX (US); Simon Joshua Jacobs, Lucas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 57 days.

(21) Appl. No.: 15/815,849

(22) Filed: Nov. 17, 2017

(65) Prior Publication Data

US 2019/0152773 A1 May 23, 2019

(51) Int. Cl.
*B81C 1/00* (2006.01)
*H03L 7/26* (2006.01)
*G04F 5/14* (2006.01)

(52) U.S. Cl.
CPC ...... *B81C 1/00293* (2013.01); *B81C 1/00047* (2013.01); *B81C 1/00246* (2013.01); *G04F 5/14* (2013.01); *H03L 7/26* (2013.01)

(58) Field of Classification Search
CPC .................................................. B81C 1/00293
USPC ..................................................... 331/94.1, 3
See application file for complete search history.

(56) References Cited

U.S. PATENT DOCUMENTS

| | | | |
|---|---|---|---|
| 3,388,339 | A | 6/1968 | Malnar et al. |
| 8,217,724 | B2 | 7/2012 | Briggs et al. |
| 8,624,682 | B2 | 1/2014 | Ridley et al. |
| 8,680,854 | B2 | 3/2014 | Dyer et al. |
| 8,836,327 | B2 | 9/2014 | French et al. |
| 8,906,470 | B2 | 12/2014 | Overstolz et al. |
| 9,201,404 | B2 | 12/2015 | Harasaka et al. |
| 9,529,334 | B2 | 12/2016 | Herbsommer et al. |
| 9,639,062 | B2 | 5/2017 | Dyer et al. |
| 2005/0007118 | A1 | 1/2005 | Kitching et al. |
| 2005/0271250 | A1 | 12/2005 | Vallone et al. |
| 2006/0022761 | A1 | 2/2006 | Abeles et al. |
| 2007/0247241 | A1 | 10/2007 | Braun et al. |
| 2010/0156547 | A1 | 6/2010 | McGuyer et al. |

(Continued)

OTHER PUBLICATIONS

Deegan et al., "Capillary Flow as the Cause of Ring Stains from Dried Liquid Drops", Letters to Nature, Nature, vol. 389, Oct. 23, 1997, Macmillan Publishers Ltd., pp. 827-829.

(Continued)

*Primary Examiner* — Joseph Chang
(74) *Attorney, Agent, or Firm* — Michael A. Davis, Jr.; Charles A. Brill; Frank D. Cimino

(57) ABSTRACT

Disclosed examples provide gas cells and a method of fabricating a gas cell, including forming a cavity in a first substrate, forming a first conductive material on a sidewall of the cavity, forming a glass layer on the first conductive material, forming a second conductive material on a bottom side of a second substrate, etching the second conductive material to form apertures through the second conductive material, forming conductive coupling structures on a top side of the second substrate, and bonding a portion of the bottom side of the second substrate to a portion of the first side of the first substrate to seal the cavity.

21 Claims, 11 Drawing Sheets

(56) References Cited

U.S. PATENT DOCUMENTS

2010/0189605 A1* 7/2010 Schmid .................. B01L 3/508 422/552
2011/0128082 A1* 6/2011 Maki ........................ G04F 5/14 331/94.1
2011/0147367 A1* 6/2011 Borwick, III ............ G04F 5/14 219/482
2013/0015850 A1 1/2013 Lindorfer et al.
2013/0044921 A1 2/2013 In et al.
2013/0147472 A1 6/2013 French et al.
2013/0176703 A1 7/2013 Hopper et al.
2014/0347074 A1 11/2014 Nadeau
2014/0368377 A1 12/2014 Nadeau et al.
2014/0373599 A1 12/2014 Trombley et al.
2015/0001694 A1 1/2015 Hopper et al.
2015/0027908 A1 1/2015 Parsa et al.
2015/0028866 A1 1/2015 Parsa et al.
2015/0084707 A1 3/2015 Maki
2015/0244382 A1* 8/2015 Ishihara .................... H03L 7/26 331/94.1
2015/0277386 A1* 10/2015 Passilly .................. G04F 5/145 331/94.1

OTHER PUBLICATIONS

Gelderblom, “Fluid Flow in Drying Drops”, Henneke Gelderblom, Physics of Fluids, Univ. of Twente, Enschede, The Netherlands, Apr. 19, 2013, 152 pgs.
Hasegawa et al., “Microfabrication of Cesium Vapor cells with Buffer Gas for MEMS Atomic Clocks”, Sensors and Actuators A 167 (2011): Physical, Elsevier, pp. 594-601.
Woetzel et al., “Microfabricated Atomic Vapor Cell Arrays for Magnetic Field Measurements”, Review of Scientific Instruments 82, 033111 (2011, downloaded May 26, 2011 to 129.215.149.92). American Institute of Physics, 4 pgs.

* cited by examiner

HERMETICALLY SEALED PACKAGE FOR MM-WAVE MOLECULAR SPECTROSCOPY CELL

BACKGROUND

Molecular spectroscopy in the microwave to millimeter wave region can be used in constructing Microwave or millimeter-wave atomic clocks and other systems that require accurate timing signals. Atomic clocks excite the gas within a gas cell using mm-wave radiation induced by a RF transceiver and the system detects the rotational quantum transition of dipolar molecules for a reference. The gas cell is ideally a hermetically sealed environment including a desired target gas at a stable low pressure. Millimeter-wave chip-scale atomic clocks (mmWCSAC) can be used in a variety of product applications to provide a highly stable and accurate clock signal. Contemplated mmWCSAC designs integrate a chip-scale gas cell (e.g., physics cell) with an application specific integrated circuit (ASIC). However, difficulties arise in producing a low leakage chip-scale or wafer-scale gas cell that will maintain a desired cavity pressure over a product lifetime of several years or more. In particular, if the pressure and/or humidity within the mmW-CSAC drifts too far from the originally manufactured specification through leakage, the cell will not function as intended due to pressure-broadening phenomena and/or improper attenuation at the dipolar molecular resonance.

SUMMARY

Disclosed examples provide gas cells fabrication methods which can be used to produce microwave or millimeter-wave atomic clocks. Example methods include forming a cavity in a first substrate, forming a first conductive material a sidewall of the cavity, forming a glass layer or other dielectric material on the first conductive material, forming a second conductive material on a bottom side of a second substrate, etching the second conductive material to form apertures through the second conductive material, forming conductive coupling structures on a top side of the second substrate, and bonding a portion of the bottom side of the second substrate to a portion of the first side of the first substrate to seal the cavity. Further example methods include forming a cavity between first and second sides of a first substrate, forming a first conductive material on a sidewall of the cavity and on a portion of the second side of the first substrate, forming a second conductive material on a bottom side of a second substrate, etching the second conductive material to expose the bottom side of the second substrate to form first and second spaced apertures through the second conductive material, forming first and second conductive coupling structures on a top side of the second substrate, bonding a portion of the bottom side of the second substrate to a portion of the first side of the first substrate, forming a third conductive material on a top side of a third substrate, forming a glass layer on the third conductive material; and bonding a portion of the third conductive material on the top side of the third substrate to a portion of the first conductive material on the second side of the first substrate to seal the cavity. Example gas cells include a first substrate with a cavity and a first conductive material on a sidewall of the cavity, a second substrate with conductive coupling structures on a top side and a second conductive material with apertures on a bottom side, a bottom conductive material formed on a bottom of the cavity, and a glass layer disposed on the bottom conductive material, where the first conductive material is spaced from one of the second conductive material and the bottom conductive material.

DETAILED DESCRIPTION

Figure 1:
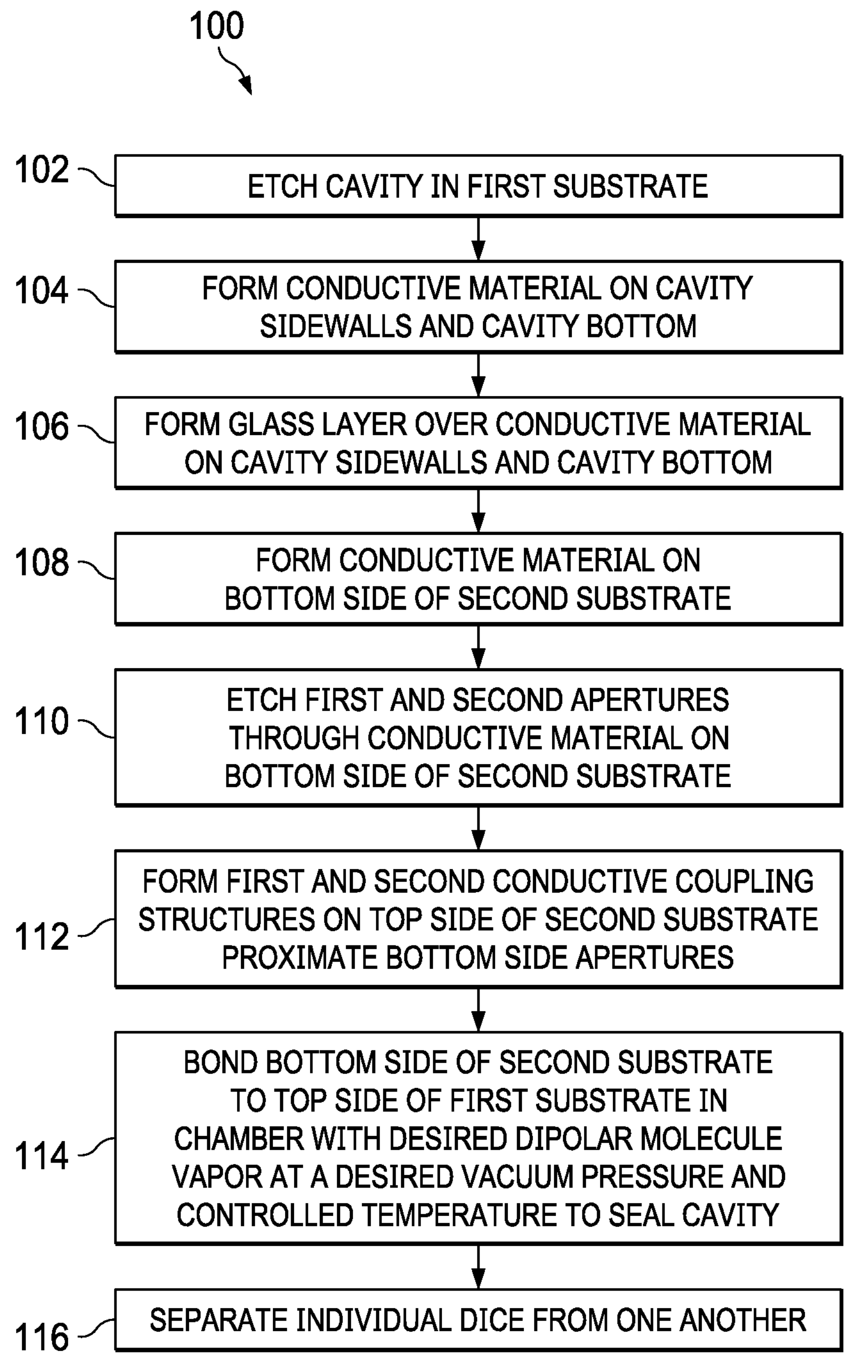
FIG. 1 is a flow diagram of an example method of fabricating a gas cell.

In the drawings, like reference numerals refer to like elements throughout, and the various features are not necessarily drawn to scale. Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

Figure 2:
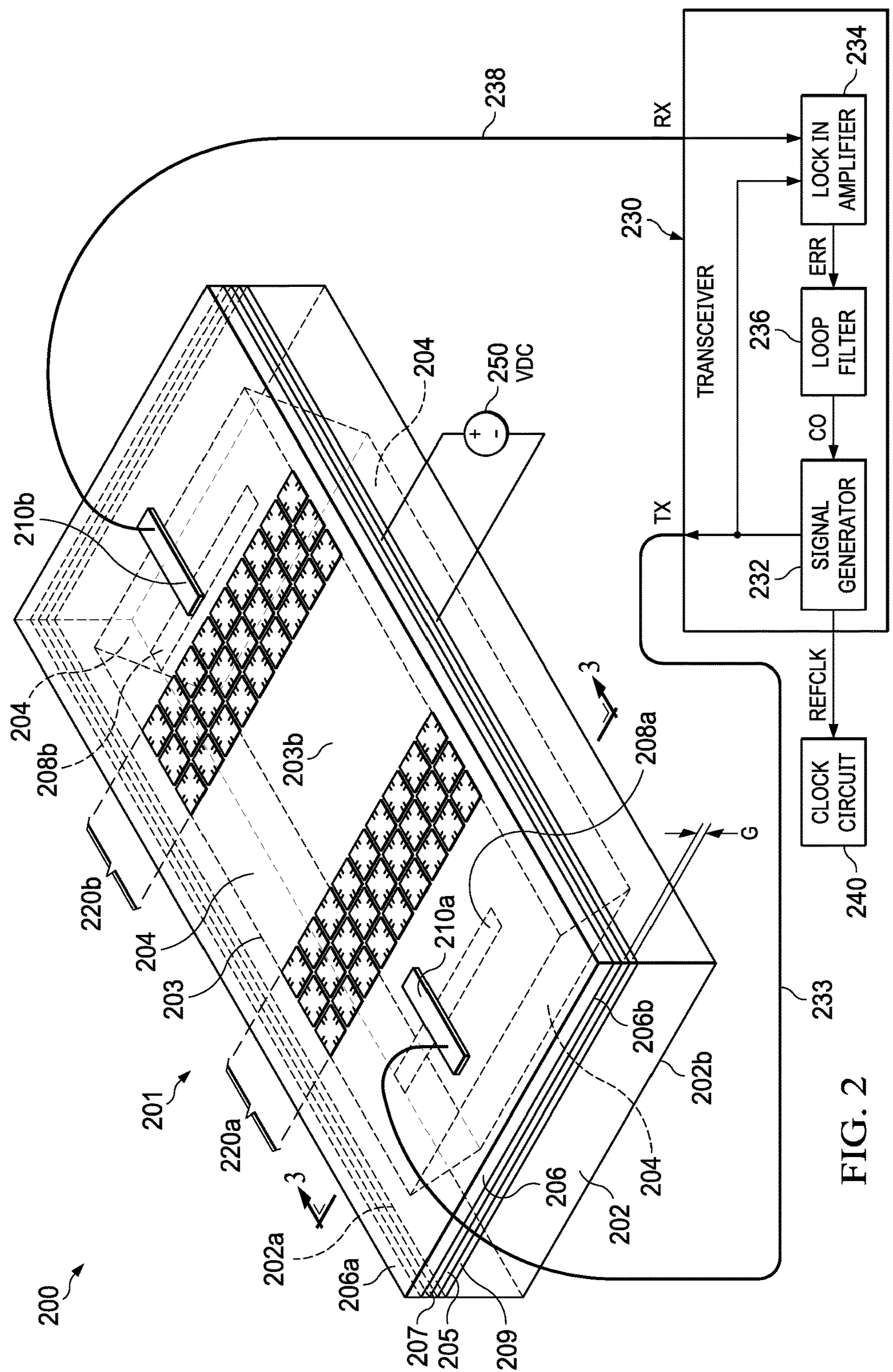
FIG. 2 is a partial perspective view of an example rotational transition based clock apparatus with a dipolar molecule gas cell and an associated transceiver circuit for providing a reference clock signal.

FIG. 1 shows an example method 100 for fabricating a gas or physics cell and FIG. 2 shows an example rotational transition based clock apparatus 200 with a dipolar molecule gas cell 201 and an associated transceiver circuit 230 for providing a reference clock signal. The method 100 can be used with a variety of target gases to provide compact, energy efficient rotational transition clock systems 200 using low-cost packaging and fabrication processes to facilitate low leakage wafer scale or chip scale rotational spectroscopy cells or gas cells 201 in a silicon-based process for use in atomic clocks and other applications. Target gas molecules (e.g., water or H2O, OCS, ammonia etc.) have defined quantum rotational state transitions, and such molecules absorb energy at a very repeatable frequency when transitioning between rotational states. For example, water absorbs energy based on quantum rotational state transitions at 183.31 GHz. In one example, the clock apparatus 200 in FIG. 2 includes a gas cell 201 fabricated in a silicon-based process, which does not require lasers, modulators, photo detectors and other optical components and does not require associated temperature stabilization (e.g., heating) components. Further, the chip scale gas cells 201 can be combined with, or interconnected with, simple transceiver circuitry as shown in FIG. 2 to implement a cost effective and power efficient transition based atomic clock operable at much lower frequencies than electronic transition atomic clock designs, using a single relatively simple control loop, thereby mitigating the complex control techniques for conventional atomic clock architectures.

For preferred gas cell operation in some examples, the gas is ideally at a relatively low pressure, such as approximately 100 mTorr or less and the cell 201 is fabricated to provide a long lifetime (e.g., 3-10 years) with low leakage rate (e.g., 1E-14 atm-cc/s). Low operating cell pressure advantageously reduces the effects of pressure broadening due to intermolecular collisions, and decreases the linewidths of the observed spectral lines. This leads to very sharp transitions and good frequency stability, such as in the parts per trillion range or better. The transitions can be used as references for a variety of very accurate timing devices including clock circuits. The example method 100 facilitates low leakage sealing of the gas cell cavity 203 during fabrication, and disclosed examples include anodic bonding processing to bond first and second substrates 202 and 206 to facilitate low leakage. FIGS. 1 and 4-9 show wafer scale or chip scale fabrication techniques by which gas cells 201 and atomic clock systems 200 can be produced using silicon or other semiconductor-based integrated circuit processes for compact, low power, and cost effective solutions. FIG. 1 shows a method 100 for fabricating a gas cell 201, with various interconnection techniques being possible for subsequently integrating the produced gas cell 201 with a transceiver circuit 230 to provide a clock system 200 as shown in FIG. 2. FIGS. 3-9 show the example gas cell 201 at various stages of fabrication processing according to the method 100.

Figure 4:
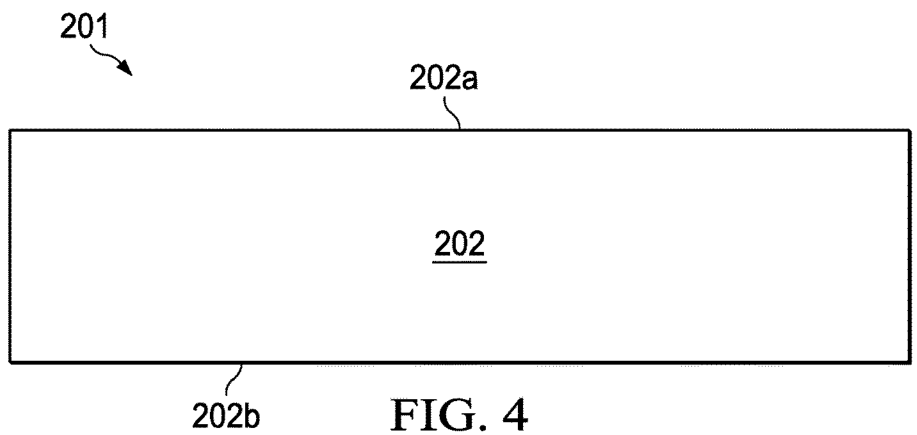
FIG. 4 is a partial side elevation view of a first substrate.
Figure 5:
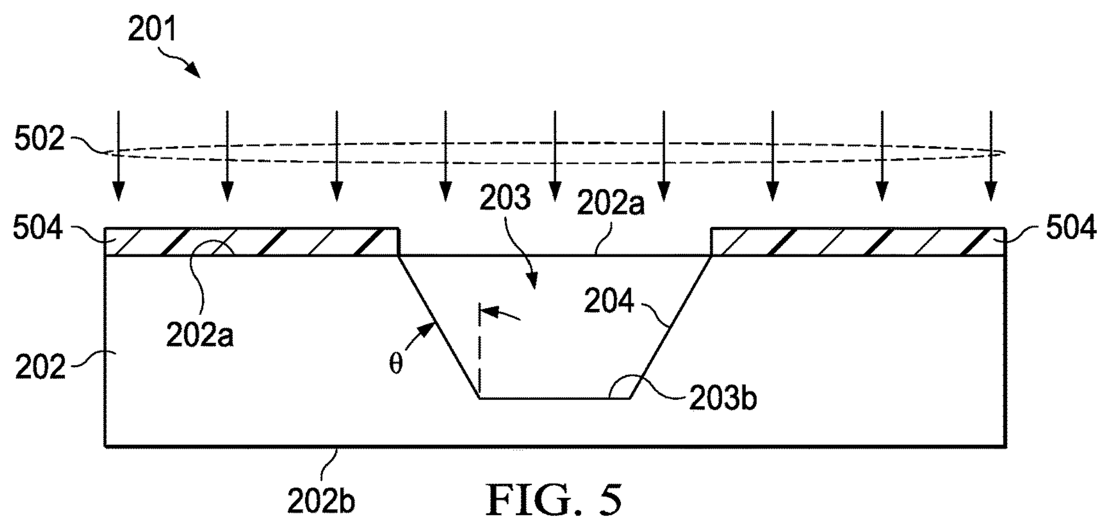
FIG. 5 is a partial side elevation view of the first substrate of FIG. 4 undergoing an etch process to form a cavity.

The method 100 includes forming a cavity 203 in a first side 202*a* of a first substrate 202 at 102. FIG. 4 shows an example first substrate 202 with first and second (e.g., top and bottom) sides 202*a* and 202*b*, respectively. FIG. 5 shows the first substrate 202 undergoing an etch process 502 to form a cavity 203 in the first side 202*a* using an etch mask 502. In one example, the first substrate is a silicon wafer. Other substrate materials can be used in different examples, such as glass. Any suitable wet or dry etch processing 502 can be used as shown in FIG. 5 for the cavity formation at 102 in FIG. 1. In some examples, multiple cavities 203 can be formed in a single substrate 202, such as for creating multiple gas cells 201, with eventual die separation used to separate the individual gas cells 201 from one another at 116 in FIG. 1. The shape of the cavity 203 is formed at 102 by patterning using a hard mask 504 as shown in FIG. 5. In one example, the etch process 502 is an anisotropic etch which forms the cavity 203 including sidewalls 204 extending at a non-zero angle θ. In other examples, an isotropic etch can be used, which forms cavity sidewalls at approximately zero angle. In other examples, a polymeric resist can be used, which is specifically formulated to resist the etchant (e.g., Brewer Science ProTek family of resists) together with bulk anisotropic etching of the silicon substrate 202 via process 502, such as using strong caustic etchants such as KOH or TMAH (e.g., TMAH or KOH wet etching process 502). The etch process 502 forms at least one sidewall 204 along with a cavity bottom 203*b* having a generally smooth surface. The process 502 in certain examples provides a cavity bottom and sidewall roughness below approximately 50 nm RMS for reducing electromagnetically induced current losses in operation of the gas cell 201. In another example, the etch process 502 etches through the silicon substrate 202 down to a buried etch stop layer (not shown), which may be formed by directly bonding a first substrate including silicon to a second substrate (not shown), which may be of silicon or another material (e.g., glass), with a dielectric layer (e.g., silicon dioxide or silicon nitride) therebetween. Such a direct bond may be achieved by several methods known for wafer bonding, where one example uses low-temperature plasma activated fusion bonding for lowest cost and high throughput. After the cavity formation at 102 in FIG. 1 and etch process 502 in FIG. 5, any required mask 504 is removed and clean up processing may be performed. In some examples, a dielectric layer may be formed on the cavity walls 204 and on the cavity bottom 203*b* for enhancing the adhesion of subsequently deposited metal materials using any suitable deposition process, such as vapor phase deposition, sputtering, chemical vapor deposition (CVD), atomic layer deposition (ALD), etc, where one suitable dielectric layer is Tantalum pentoxide (Ta2O5) for good adhesion to copper or a Titanium layer can be used for the same purpose.

Figure 6:
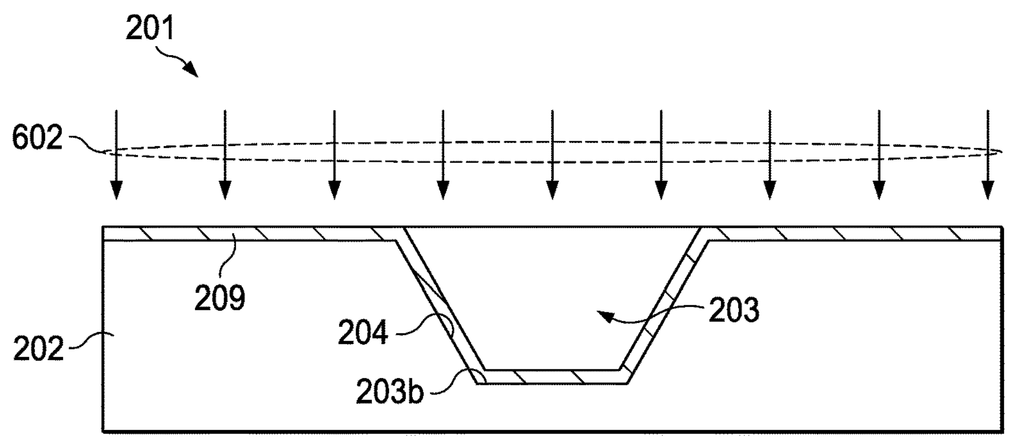
FIG. 6 is a partial side elevation view of the first substrate of FIGS. 4 and 5 undergoing a deposition operation to form a conductive material on the cavity bottom and sidewalls.

The method 100 also includes forming a first conductive material 209 on a sidewall 204 of the cavity 203 at 104. In the example of FIG. 6, a first conductive structure 209, such as a copper or aluminum layer, is formed using a deposition process 602 on the first side 202*a* and along the cavity sidewalls 204 and the cavity bottom 203*b* at 104. In one example, the deposited conductive material 209 is copper or gold (if oxidation of the gases inside the cavity is a problem), and the surface roughness is approximately 50 nm or less for minimizing losses due to currents induced by the electromagnetic field inside the cavity 203. One suitable deposition process 602 is sputtering of copper metal onto a deposited dielectric layer to provide high conductivity, absence of long-range magnetic order, good adhesion to Ta2O5 or Ti, and low cost. Other metal materials can be used in different examples, such as those having a similar combination of characteristics. In one example, an aluminum layer 209 is deposited at 104 via the process 602 of FIG. 6, to a thickness of approximately 1 μm. Following the sputter deposition 602 in one example, the metal layer 209 may be grown to a desired uniform thickness with copper or any other metal that may be desired, such as using electroplating for reduced deposition cost. In some examples, the formed metal layer may be coated with a dielectric material via vapor phase deposition or other suitable process, where the optional dielectric material in certain examples may be selected to mitigate reaction of the vapor phase molecules of the gas cell 201 with the metal layer during the expected product lifetime. Any included dielectric may be removed by patterning and etching from all or a target bonding portion of the top surface 202*a* of the first substrate 202 to facilitate bonding with a second substrate 206 to close or seal the cavity 203 as described further below. In this example, the conductive material 209 is formed on the sidewalls 204 and the cavity bottom 203*b* at 104 in FIG. 1 to a thickness greater than the skin depth at the frequency of operation of the finished gas cell 201, for example, about 5-10 times the skin depth of the operating frequency, such as approximately 100 nm or more and approximately 1-2 μm or less to provide a surface roughness of approximately 50 nm or less for mitigating signal losses in the cavity 203. In another possible example, the conductive material 209 is deposited gold formed to a thickness of approximately 1-2 μm. In one example, the conductive material 209 is formed to a thickness of approximately three times the skin depth at the frequency of interest or more.

Figure 3:
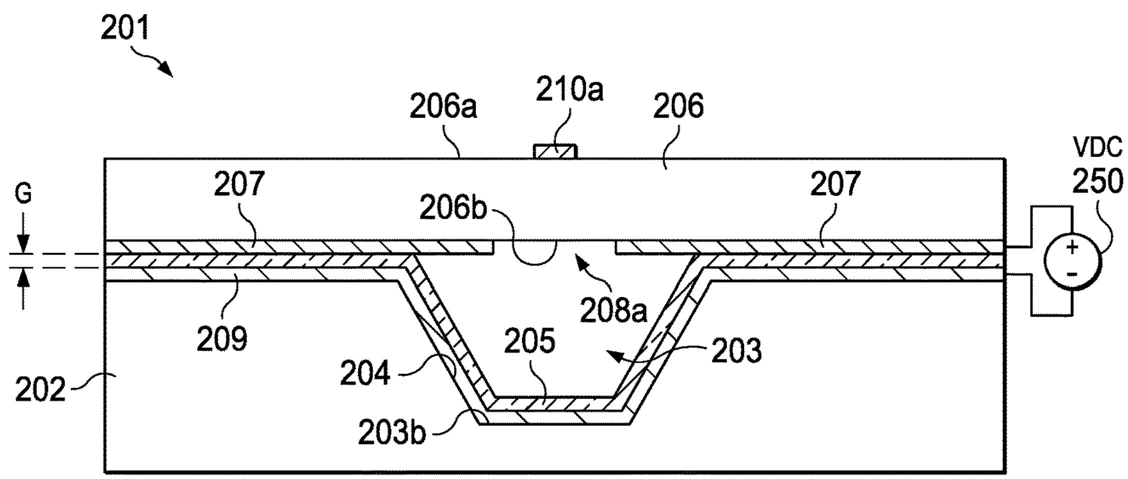
FIG. 3 is a partial sectional side elevation view of the gas cell taken along line 3-3 in FIG. 2.
Figure 7:
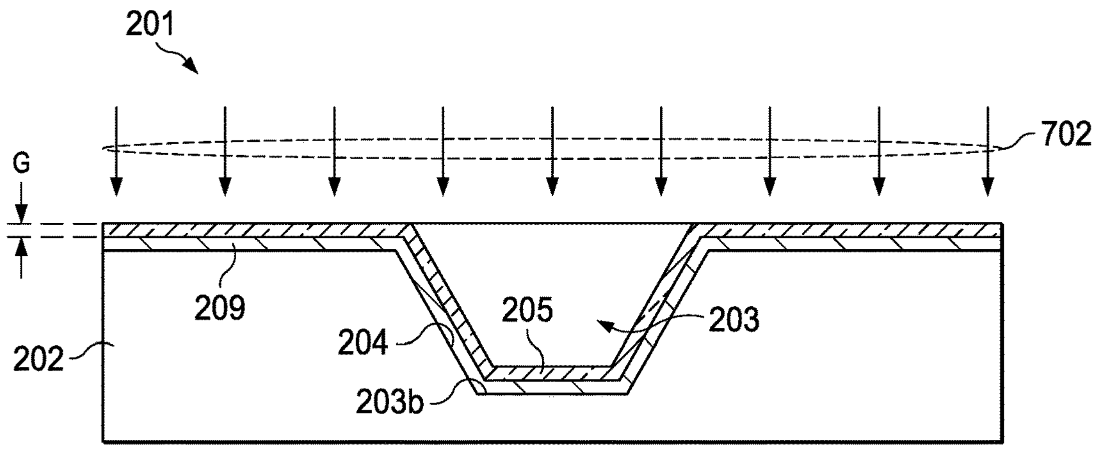
FIG. 7 is a partial side elevation view of the first substrate of FIGS. 4-6 undergoing a deposition operation to form a glass layer on the conductive material on the cavity bottom and sidewalls.

The illustrated method 100 also includes forming a glass layer 205 on the first conductive material 209 at 106. FIG. 7 illustrates one example in which a glass deposition process 702 is performed, which forms a borosilicate glass material layer 205 over the first conductive material 209, including covering the conductive material 209 above the top side 202*a*, the sidewall portions 204 and the cavity bottom 203*b*. One example includes performing a sputter deposition process 702 which deposits the borosilicate glass layer 205 over the first conductive material 209. In one example, structured borosilicate glass layers 205 are deposited at 106 by plasma-assisted e-beam evaporation processing 702 in FIG. 7. The glass layer 205 is deposited at 106 to any suitable thickness. In the illustrated example, the thickness provides a gap having a thickness G in the finished cell 201, which separates the first conductive material 209 from a top side conductive material 207 of a second substrate 206, as shown in FIG. 3. As discussed further below, the gap G appears as an electrical short circuit for the frequencies of interest for operation of the gas cell 201, and thus does not significantly inhibit waveguide operation within the cavity 203. Moreover, the provision of the glass layer 205 in the illustrated example facilitate use of anodic bonding of first and second substrates to facilitate practical fabrication of low-leakage gas cells 201.

Continuing at 108, the method 100 includes forming a second conductive material 207 on a bottom side 206*b* of a second substrate 206, etching the second conductive material 207 to form apertures 208*a* and 208*b* through the second conductive material 207 at 110, and forming conductive coupling structures 210*a* and 210*b* on a top side 206*a* of the second substrate at 112. The gas cell structure 201 in FIGS. 2 and 3 is formed from first and second substrates 202 and 206, for example, where the first substrate 202 is a semiconductor structure, such as a silicon wafer. The first substrate 202 includes an upper first side 202*a*, a lower second side 202*b*, and a cavity 203 formed at least partially in the first side 202*a*. The second substrate 206 is a glass structure, such as borosilicate glass. The second substrate 206 in one example includes a top side 206*a*, a bottom side 206*b*. First and second conductive coupling structures 210*a* and 210*b* are formed on the top side 206*a*, and a second conductive material 207 is formed on the bottom side 206*b*. A portion of the second conductive material 207 forms a top of the cavity 203 and includes first and second spaced apertures 208 extending through the second conductive material 207.

Figure 8:
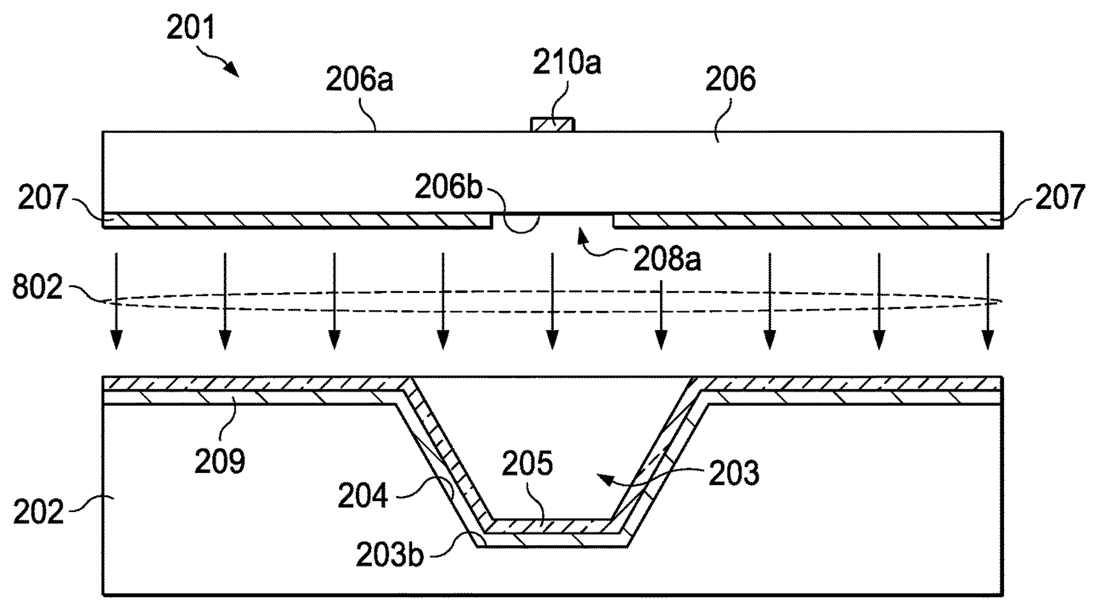
FIG. 8 is a partial side elevation view of a second substrate being bonded to a top side of the first substrate of FIGS. 4-7.

Referring to FIGS. 1 and 8, the example gas cell 201 is constructed by bonding the first substrate 202 with a second substrate 206 to seal the cavity 203. The illustrated method 100 includes processing the second substrate at 108-112 to include a lower second conductive material 207 with apertures 208, as well as top-side conductive coupling structures 210. The second substrate 206 will later be used to form a cavity top through bonding with the first substrate 202. The second substrate 206 can be any suitable material, such as a borosilicate glass or ceramic wafer having a thickness less than a wavelength of the gas cell operating frequency (e.g., less than 0.5 mm in one example). In practice suitable second substrates 206 are thin enough to facilitate good electromagnetic coupling of microwave energy through the apertures 208 to and from the cavity 203, and thick enough to mitigate or avoid structural distortion when bonded to the first substrate 202 to seal the cavity 203 under vacuum. In certain examples, the second substrate material provides good electromagnetic transmissivity through subsequently patterned non-conductive apertures 208 formed in the material 207. One suitable example material is Corning Eagle XG glass, a low-alkali borosilicate glass available in wafer form of thicknesses ranging from 0.2-3.0 mm. The second substrate 206 in certain examples is coated with a dielectric (e.g., Ta2O5 or Ti) on each side 206*a* and 206*b* for improving adhesion of metal films, which are later formed over the dielectric. In one example, the second substrate 206 is a borosilicate glass structure, with top and bottom sides 206*a* and 206*b*.

As further shown in FIG. 8, the second substrate 206 includes a second conductive material 207 formed at 108 in FIG. 1 on portions of the bottom side 206*b*. First and second apertures 208*a* and 208*b* are etched in the second conductive material layer 207 at 110 in FIG. 1. The first aperture 208*a* is shown in FIG. 8, and both apertures 208*a* and 208*b* are shown in the perspective view of FIG. 2. At 112 in FIG. 1, first and second conductive coupling structures 210*a* and 210*b* are formed on the top side 206*a* of the second substrate 206. FIG. 8 shows the first coupling structure 210*a*, and both coupling structures 210*a* and 210*b* are shown in FIG. 2. In one example, the second conductive material 207 is formed (108 in FIG. 1) on the bottom side 206*b* of the second substrate 206 using a deposition process (not shown), which can be similar to the process 602 used in forming the first conductive material layer 209 as shown in FIG. 6 above. The conductive material deposition and patterning can be done separately for the first and second sides 206*a* and 206*b* of the second substrate 206. In one alternate example, the top and bottom sides 206*a* and 206*b* can be completely metalized in one step, followed by a subsequent selective patterning to leave the desired conductive and non-conductive regions on both sides 206*a* and 206*b*. In the illustrated example, the bottom side 206*b* is etched via a masked etch process (not shown) to form first and second spaced apertures 208*a* and 208*b*, respectively, through the conductive material 207 on the bottom side 206*b*, and the remainder of the bottom side 206*b* is covered by the remaining conductive material 207. The apertures or slots 208 form part of the electromagnetic coupling structure that will allow an electromagnetic field to enter and exit the cavity 203 in the finished gas cell 201 as described further below in connection with FIG. 2.

The first and second conductive coupling structures 210*a* and 210*b* are formed on the first side 206*a* of the second substrate 206, proximate to the corresponding apertures 208*a* and 208*b* formed along the bottom side 206*b*, as shown in FIG. 2. A deposition process (not shown) is used to plate the first side 206*a* with copper or other suitable conductive material, and a masked etch process is performed which forms the first and second conductive coupling structures 210*a* and 210*b* shown in FIG. 2. In one example, the conductive coupling structures 210*a* and 210*b* are formed as conductive strips extending longitudinally across the underlying apertures 208*a* and 208*b*, respectively, for electromagnetically coupling with the interior of the waveguide cavity 203. In subsequent packaging with a host transceiver 230 (e.g., FIG. 2), the coupling structures 210 can be electrically coupled with inputs 233 and 238 using any suitable flip chip, wire bonding, or other electrical interconnection technique to provide a simple and cost-effective packaging assembly with the finished gas cell structure 201 mounted to a host integrated circuit package or printed circuit board (not shown). In operation, the first coupling structure 210*a* receives the transmit signal TX from the output 233 of the transceiver 230 and produces a magnetic field, which is directed through the aperture 208*a* to the dipolar molecule gas inside the sealed cavity 203.

As shown in FIGS. 2 and 3, the gap G between the first conductive material 209 and the top side conductive material 207 of the second substrate 206 facilitates application of a DC bias voltage VDC between the structures 207 and 209. FIGS. 2 and 3 show a DC voltage source 250 with terminals connected to the conductive structures 207 and 209 to create a DC electric field inside the cavity 203. In operation, the DC electric field introduces a preferential orientation of the dipolar molecules to boost the overall magnitude of the absorption of the gas at the quantum transition frequency. The DC electric field helps to align the molecules in a preferential direction that could improve the absorption of the high frequency EM wave travelling through the cavity 203. Without the DC field, the gas molecules will have a random orientation so only a fraction of them will be aligned with the high frequency EM field to absorb the photons and transition to the next rotational state. Certain example systems include the DC source 250 for generating the reference clock signal REFCLK. The applied DC bias does not impede operation of the metallic waveguide to transmit the signal between the TX and RX antennas 210*a* and 210*b*.

As further shown in FIG. 2, the top side 206*a* of the second substrate 206 in one example also includes patterned conductive electronic bandgap (EBG) structures 220 formed on the outer surface 206*a* of the gas cell 201 via the etch mask used to form the coupling structures 210. The EBG structures 220 can be omitted in other examples. The EBG structures 220 in FIG. 2 are spaced from the conductive coupling structures 210 to avoid or mitigate propagation of spurious surface waves. In the example of FIG. 2, the EBG structures 220*a* and 220*b* each include three rows of several repeating patterns of conductive material 804. Any suitable pattern can be used for attenuating electromagnetic wave coupling along the first side 206*a* of the second substrate 206 of a given target bandgap range of frequencies, where the EBG structures 220 are spaced from and disposed between the transmit and receive coupling structures 210*a* and 210*b*. In other examples, only a single EBG structure 220 is used, spaced from and between the coupling structures 210*a* and 210*b*. Other possible examples include more than two EBG structures 220 for attenuating electromagnetic wave coupling along the first side 206*a* of the second substrate 206. The EBG structures 220 are omitted in other examples. As shown in the example second substrate 206 in FIG. 2, the apertures 208 and the coupling structures 210 are both extended rectangular shapes, although other shapes and relative positions can be used in other examples. In various examples, the apertures 208 can be either perpendicular or parallel to the direction of propagation of the TE01 mode within the cavity 203.

Because the transceiver circuit 230 in FIG. 2 provides high frequency TX signals to the gas cell 201 (e.g., 100-1000 GHz in various examples), and since the second substrate 206 has a thickness of fractions of a wavelength in certain examples, surface waves can propagate along a grounded dielectric slab or along the top surface 206*a* of the cell 201, and couple between the input and output apertures 208 of the waveguide, thereby creating a second path for the signal that does not pass through the gas cell cavity 203, and such extra-cavity transmission can mask the absorption of the dipolar molecule gas within the cavity 203 in operation. Accordingly, some examples include one or more EBG structures 220 to mitigate such surface waves through operation as a photonic bandgap structure. In one example, the EBG structure 220 has a bandgap in an expected operational range of frequencies to mitigate or prevent surface wave propagation for example, being tuned to be in the range of frequencies used to interrogate the gas cell 201. The EBG is a tuned filter including the parallel combination of the conducting layer 207 on the second or bottom side 206*b* of the second substrate 206 and the patterned array of repeating unit cells 220 on the first or top side 206*a*. In the illustrated examples, no vias are required, but vias can be used in other examples. In one example, the waveguide cavity 203 is etched with a top width of 1.5 mm and an etch depth of 0.5 mm to provide a propagation constant and cutoff for the first three modes with a first mode beginning at 220 GHz, a second mode at 230 GHz, and a third mode at 290 GHz, and the cavity 203 is designed in one example for operation in a frequency range where only the first mode can propagate (which can be tuned by changing the waveguide dimensions in other examples). In this example, there is a band gap of frequencies ranging from 160-195 GHz at which no mode can propagate along the top side 206*a*, with the EBG arrays 220 placed between the two ports of the waveguide to prevent a second path for the electromagnetic signal in the bandgap of interest.

Figure 9:
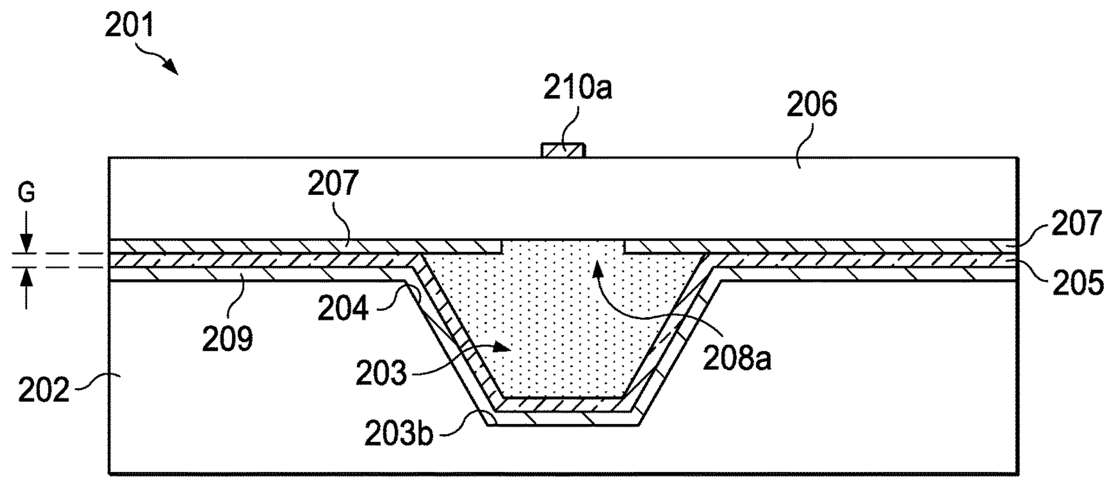
FIG. 9 is a partial sectional side elevation view of the gas cell after bonding of the first and second substrates of FIGS. 4-8.

Referring now to FIGS. 1, 8 and 9, the method 100 in FIG. 1 continues at 114 with bonding a portion of the bottom side 206*b* of the second substrate 206 to a portion of the first side 202*a* of the first substrate 202 to seal the cavity 203. In one example, the bonding at 114 includes performing an anodic bonding process 802 in FIG. 8 which bonds a portion of the glass layer 205 to a portion of the second conductive material 207 to form the cavity seal. In the illustrated example of FIGS. 2 and 9, the anodic bonding process at 114 creates a gap G between the first conductive material 209 and the second conductive material 207. The gap G in this example is set by the thickness of the glass layer 205 formed at 106 in FIG. 1. In one example, the cavity sealing or bonding at 114 in FIG. 1 includes bonding the bottom side. 206*b* of the second substrate 206 via an anodic bonding process 802 at a low ambient pressure to the first side 202*a* of the first substrate 202 to form a sealed cavity 203. The processing 802 is performed in an environmentally controlled processing chamber (not shown) with a controlled pressure and with controlled introduction of a desired chemistry to provide the final desired post-sealing dipole molecular gas within the sealed chamber 203. In one example, He or N2 is also provided in the processing chamber during bonding to facilitate testing for cavity leakage during manufacturing. In certain examples, the cavity pressure is in the range of Microtorr to Millitorr, and the substrates 202 and 206 are bonded and sealed at 114 in a processing chamber capable of providing and controlling both heat and vacuum. Suitable processing chambers for the bonding process 1300 are commercially available from suppliers such as Electronic Visions Group (EVG), Austria.

The substrates 202 and 206 are placed in the chamber, and a suitable vacuum headspace with a small partial pressure is established. The substrates 202 and 206 are then bonded according to a corresponding suitable temperature profile for creating an impermeable seal of each separate cavity 203 of a processed wafer, with all cavities being bonded essentially concurrently at the wafer level. In one example, the deposition process 802 is performed at temperatures of 250 to 400 degrees C., or with sputtered glass 205 at approximately 400 degrees C. In an alternate implementation, the cavities 203 may be sequentially sealed by apparatus (not shown) which uses laser radiation to locally heat the bonding regions to the suitable temperature while maintaining a lower temperature of the surrounding die. In certain examples, the anode at bonding process 802 includes applying a control voltage between the substrates 202 and 2062 form a bond between the interfacing conductive material 207 and the glass material layer 205, while introducing a desired dipolar gas in the processing chamber. Anodic bonding, is sometimes alternately referred to as field assisted bonding or electrostatic bonding, and can be used to seal glass 205 to either silicon or metal 207 without introducing an intermediate layer. The process 802 provides atomic contact between the bonding substrates 202, 206 through a sufficiently powerful electrostatic field, and the presence of a borosilicate glass 205 with a high concentration of alkali ions at the bonding interface facilitates controlled low-leakage seal creation, particularly where the coefficient of thermal expansion (CTE) of the processed glass layer 205 is similar to that of the deposited metal layer 207.

In certain examples, multiple cavities 203 are formed in a single substrate 202, such as for creating multiple gas cells 201, and die separation is performed at 116 to separate the individual gas cells 201 from one another. As shown in FIG. 2, the example gas cell 201 includes a chamber or cavity 203 with a sealed interior enclosing a dipolar molecule material gas, such as water (H2O) or any other dipolar molecule gas at a relatively low gas pressure inside the cavity 203. Examples of suitable electrical dipolar material gases include water, acetonitrile (CH3CN), ammonia, OCS and hydrogen cyanide (HCN). The clock system in FIG. 2 includes a transceiver 230 with a transmit output 233 for providing an electrical transmit signal (TX) to the gas cell 201, as well as a receiver input 238 for receiving an electrical input signal (RX) from the gas cell 201. Unlike electronic transition gas cells, the rotational transition gas cell structure 201 does not require optical interrogation, and instead operates through electromagnetic interrogation via the transmit and receive signaling TX, RX provided by the transceiver 230. The glass layer 205 of the gas cell 201 extends between the first conductive material 209 on the sidewall 204 and the second conductive material 207 to define the gap G between the first conductive material 209 on the sidewall 204 of the cavity 203 and the second conductive material 207 along the top of the cavity 203. In this example, moreover, the second conductive material 207 extends between the first side 202*a* of the first substrate 202 and the top side 206*a* of the second substrate 206. The provision of the gap G facilitates the use of anodic processing 8022 by the substrates 202 and 206, while providing a low leakage seal the cavity 203. In further examples discussed below (e.g., FIGS. 13-17), the second conductive material layer 207 is provided only within the lateral boundaries of the prospective cavity 203, and the glass material of the second substrate 206 is bonded to the glass material layer 205 of the first substrate 202, leaving an angled gap G formed by the glass material 205 that extends between the conductive material 207 on the top side of the cavity 203 and the first conductive material 209 formed on the sidewall 204 of the cavity 203.

As shown in FIGS. 2, 3 and 9, the sealed cavity 203 includes a conductive interior cavity surface, as well as first and second non-conductive apertures 208*a* and 208*b* formed in the interior cavity surface for providing an electromagnetic field entrance and an electromagnetic field exit, respectively. As described hereinabove, the provision of the gap G during manufacturing of the cell 201 means that there is no DC electrical continuity between the conductive material 207 along the upper portions of the cavity 203 and the remaining conductive material 209 along the cavity bottom 203*b* and the cavity sidewalls 204. However, the resulting gas cell structure still operates properly at high frequencies of interest to provide a conductive waveguide between the entrance and exit apertures 208*a* and 208*b*. In one example, the apertures 208 magnetically couple into the TE10 mode of the waveguide cavity 203. In other examples, the apertures 208 excite higher order modes.

As shown in FIG. 2, the first conductive coupling structure 210*a* is formed on the outer surface 206*a* of the gas cell 201 proximate the first non-conductive aperture 208*a*. In the example 200, the first coupling structure 210*a* is a conductive strip formed on the upper surface 206*a* of the upper substrate 206, which overlies (e.g., and crosses over) the corresponding first non-conductive aperture 208*a* for providing an electromagnetic interface to couple a magnetic field into the interior of the cavity 203 based on the transmit signaling TX from the transceiver output 233. The second or exit coupling structure 210*b* is formed proximate the second non-conductive aperture 208*b* and provides an electromagnetic field exit from the cavity 203 to couple the electromagnetic field with the transceiver RX input 238. The proximate location of the conductive coupling structures 210 and the corresponding non-conductive apertures 208 advantageously provides electromagnetically transmissive paths through the second or upper substrate 206, which can be any electromagnetically transmissive material. In some examples, one or more conductive electronic bandgap (EBG) structures 220 are formed on the outer surface 206*a* of the gas cell 201, spaced from the conductive coupling structures 210. In operation, the EBG structures 220 attenuate electromagnetic wave coupling along the gas cell outer surface 206*a* between the transmit and receive coupling structures 210*a* and 210*b*, respectively. In other examples, the EBG structures 220 may be omitted.

The lower side 206*b* of the second substrate 206 is substantially or completely plated with conductive material (e.g., copper 207), and the apertures 208 are etched to provide non-conductive windows or apertures 208 in the lower second side 206*b*, with the coupling structures 210 and any included EBG structures 220 being formed of conductive material (e.g., copper) on the upper side 206*a* of the second substrate 206. One example includes two EBG structure patterns 220*a* and 220*b*, which can be any suitable shape and configuration for electromagnetic attenuation on the upper surface 206*a* of the gas cell 201. The cell cavity 203 is defined by the lower side 206*b* of the upper substrate 206, as well as by sidewalls 204 and a cavity bottom 203*b* formed in the first (lower) substrate 202, which can be any suitable material, such as silicon. In the example of FIG. 2, the first or lower substrate 202 includes a top or first side 202*a* into which the cavity sidewalls 204 and a cavity bottom 203*b* are formed, such as by etching (e.g., FIG. 5 above). The cell cavity 230 in this example extends along a substantially linear axis from a first end to a second end, with the first aperture 208*a* proximate the first end and the second aperture 208*b* proximate the second end. A variety of different cavity sizes and shapes may be used in other examples. One suitable example provides a generally rectangular cavity shape with a top width of approximately 1.5 mm and an etch depth of 0.5 mm with a first mode beginning at 120 GHz, a second mode beginning at 230 GHz and a third mode at 290 GHz. Other shapes, sizes and configurations of cell cavities 203 are possible.

Figure 10:
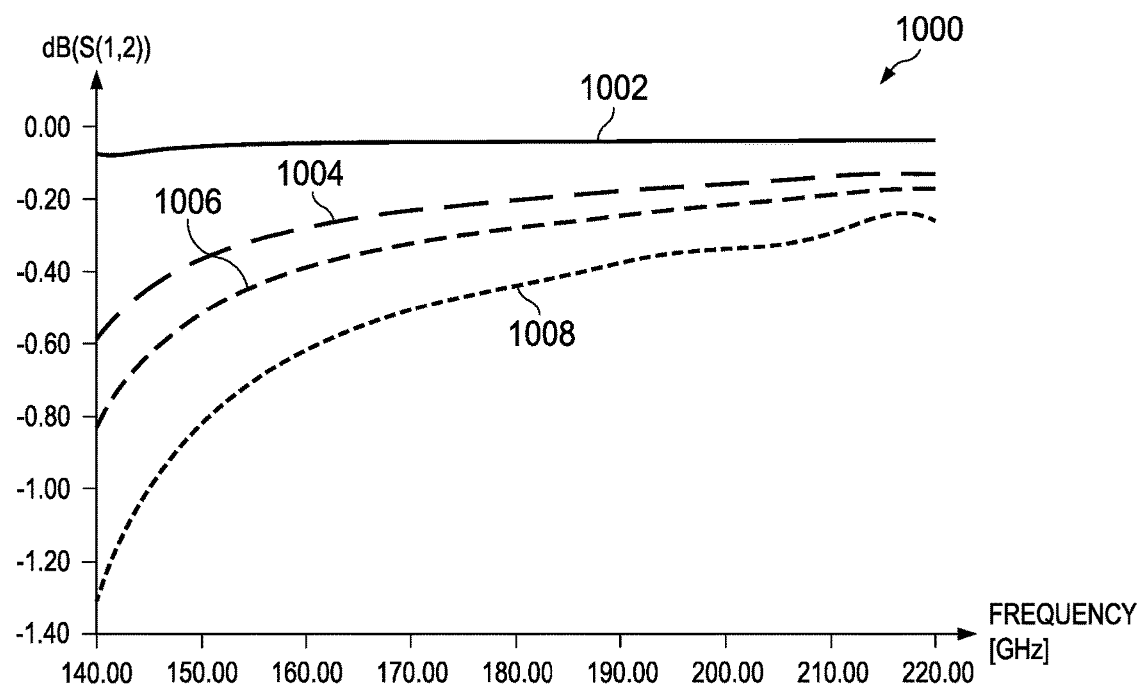
FIG. 10 is a graph of insertion loss as a function of frequency for different sidewall to top metal gap distances in the gas cell of FIG. 9.

As shown in FIG. 2, the second side 206*b* of the second substrate 206 is mounted to the first side 202*a* of the first substrate 202 to form the cavity 203. The cavity 203 includes the sealed interior with the conductive interior cavity surfaces extending at least partially along the cavity sidewall or sidewalls 204, the cavity bottom 203*b* and the lower side 206*b* of the second substrate 206. The lower second side 206*b* of the second substrate 206 provides a cavity top with a conductive surface 94 (FIG. 10 below). In some examples, the only non-conductive cavity surfaces are the non-conductive apertures 208 on the bottom 206*b* of the upper substrate 206 and the gap G. Other non-conductive portions are possible within the cavity 203 in some examples. In the illustrated example, the conductive interior cavity surfaces are plated or otherwise provided with copper or other metal material having a thickness greater than a skin depth at the frequency of the transmit output signal TX. The first and second substrates 202 and 206 are joined together as discussed above to provide the desired dipolar molecule gas (e.g., H2O) in the cavity 203 during wafer bonding at a pressure of approximately 1 mbar or less. In practice, the bond chamber pressure and the gas pressure inside the sealed cavity are generally the same, although the pressure in the cavity is generally somewhat higher than the bond chamber pressure with the release of the molecule, outgassing, etc. In certain examples, the dipolar molecule gas is at a low pressure of approximately 0.1 mbar or less and approximately 0.01 mbar or more inside the sealed interior of the cavity 203. In general, the pressure can be tailored for a given design, where the transition width depends primarily on pressure broadening and Doppler broadening. The pressure broadening factor is linear with pressure, whereas the Doppler broadening is constant with pressure. Accordingly there is one desired pressure at which further pressure reduction provides no further transition frequency width reduction due to the Doppler effect, and further pressure reduction would reduce the magnitude of the peak transition and the width will be the same, thereby degrading detection and transition tracking. Gettering agents may be introduced during wafer bonding to include getters within the resulting gas cavity 203 to getter any contaminants that may exist during the wafer bonding process and/or that may leak into the cavity 203 over time. In certain examples, the cell 201 may include pattern heaters with temperature sensors formed on or in the cell bottom 202*b* (not shown) for stabilizing the cell temperature. Such heating elements may be operable to boil off any vapor absorbed on the chamber sidewalls 204 thereby facilitating pressure stability in operation.

The transceiver circuit 230 in certain implementations is implemented on or in an integrated circuit (not shown), to which the gas cell 201 is electrically coupled for transmission of the TX signal via the output 233 and for receipt of the RX signal via the input 238. The transceiver 230 is operable when powered for providing an alternating electrical output signal TX to the first conductive coupling structure 210*a* for coupling an electromagnetic field to the interior of the cavity 203, as well as for receiving the alternating electrical input signal RX from the second conductive coupling structure 210*b* representing the electromagnetic field received from the cavity 203. The transceiver circuit 230 is operable to selectively adjust the frequency of the electrical output signal TX to reduce the electrical input signal RX by interrogation to operate the clock 200 at a frequency that substantially maximizes the molecular absorption through rotational motor state transitions, and to provide a reference clock signal REFCLK to a clock circuit 240 at the frequency of the TX output signal.

In certain examples, the transceiver 230 includes a signal generator 232 with an output 233 electrically coupled with the first conductive coupling structure 210*a* for providing the alternating electrical output signal TX, and for providing the reference clock signal REFCLK at the corresponding transmit output frequency. The transceiver 230 also includes a lock-in amplifier circuit 234 with an input 238 coupled with the second conductive coupling structure 210*b* for receiving the RX signal, and the lock-in amplifier operates for providing an error signal ERR representing a difference between the RX signal and the electrical output signal TX. In one example, the lock-in amplifier circuit 234 provides the error signal ERR as an in-phase output, and the error signal ERR is used as an input by a loop filter or controller circuit 236 for providing a control output signal CO to the signal generator 232 for selectively adjusting the TX output signal frequency to maintain this frequency at a peak absorption frequency of the dipolar molecular gas inside the sealed interior of the cavity 203. In some examples, the RF power of the TX and RX loop is controlled so as to avoid or mitigate stark shift affects.

The electromagnetic coupling via the non-conductive apertures 208 and corresponding conductive coupling structures 210 facilitates electromagnetic interrogation of the dipolar gas within the cell cavity 203, and the system 200 avoids the cost, complexity, power consumption and optical transmission problems associated with conventional electronic transition atomic clock gas cells. In one form of operation, the clock system 200 operates with the signal generator 232 transmitting alternating signals TX at full transmission power at various frequencies within a defined band around a suspected quantum absorption frequency at which the transmission efficiency of the gas cell 201 is minimal (absorption is maximal). For example, the quantum absorption frequency associated with the dipolar water molecule is 183.31 GHz. When the system operates at the quantum frequency, a null or minima is detected at the receiver via the lock-in amplifier 234, which provides the error signal ERR to the loop filter 236 for regulation of the TX output signal frequency via the control output CO signal provided to the signal generator 232. The rotational quantum frequency of the dipolar molecule gas in the gas cell cavity 203 is generally stable with respect to time (does not degrade or drift over time), and is largely independent of temperature and a large number of other variables. As a result, the clock system 200 need not include thermal or other stabilizing circuitry found in electronic transition based atomic clocks.

The transceiver system 230 in one example operates the signal generator 232 to initially sweep the transmission output frequency through a band known to include the quantum frequency of the cell 201 (e.g., transitioning upward from an initial frequency below the suspected quantum frequency, or initially transitioning downward from an initial frequency above the suspected quantum frequency, or other suitable sweeping technique or approach). The transceiver circuit 230 monitors the received energy via the input 238 coupled with (e.g., electrically connected to) the second conductive coupling structure 210*b* to identify the transmission frequency associated with peak absorption by the gas in the cell cavity 203 (e.g., minimal reception at the receiver). After the quantum absorption frequency is identified, the loop filter or controller 236 moves the source signal generator transmission frequency close to that absorption frequency (e.g., 183.31 GHz), and modulates the signal at a very low frequency (e.g., left and right along the frequency axis in FIG. 4) to regulate operation around the null or minima in the transmission efficiency representing the ratio of the received energy to the transmitted energy, with the loop filter 236 providing negative feedback in a closed loop operation to maintain the signal generator 232 operating at a TX frequency corresponding to the quantum frequency of the cavity dipolar molecule gas.

Unlike optically interrogated electronic transition type atomic clocks using alkali metal gas cells, the disclosed rotational transition based atomic clock 200 uses the rotational transition of dipolar molecules (e.g., water), where the frequency of this type of quantum transition is in the sub-THz range. In this regard, while electronic transition type atomic clocks need to excite the alkali metal gas with a laser operating at hundreds of THz (wavelengths in hundreds of nanometers), the millimeter wave clock 200 interrogates the gas with mm-wave radiation induced by a RF transceiver circuit 230. The clock 200 in certain examples can lock-in to the rotational quantum molecular transition with typical Alan deviation of 1E-10 to 1E-11 over 100 seconds averaging. In some examples, the disclosed rotational transition based atomic clock apparatus 200 works at sub THz frequency, and is therefore a simpler, lower cost and lower power solution for providing a stable reference clock signal.

In steady state operation, the lock-in amplifier 234 and the loop filter 236 maintain the transmitter frequency at the peak absorption frequency of the cell gas. In one example, the loop filter 236 provides HD control using a derivative of the frequency error as a control factor for lock-in detection and closed loop regulation. At the bottom of the null in the transmission coefficient curves of FIG. 4, the derivative is zero and the loop filter 236 feeds the derivative back as a DC control output signal CO to the signal generator 232. This closed loop operates to keep the signal generator transmission output frequency at the peak absorption frequency of the cell gas using lock-in differentiation based on the RX signal received from the cell 201. As shown in FIG. 2, further clock circuitry 240 receives a reference clock signal REFCLK for use by frequency dividers to generate system clocks in a host system (not shown).

Figure 11:
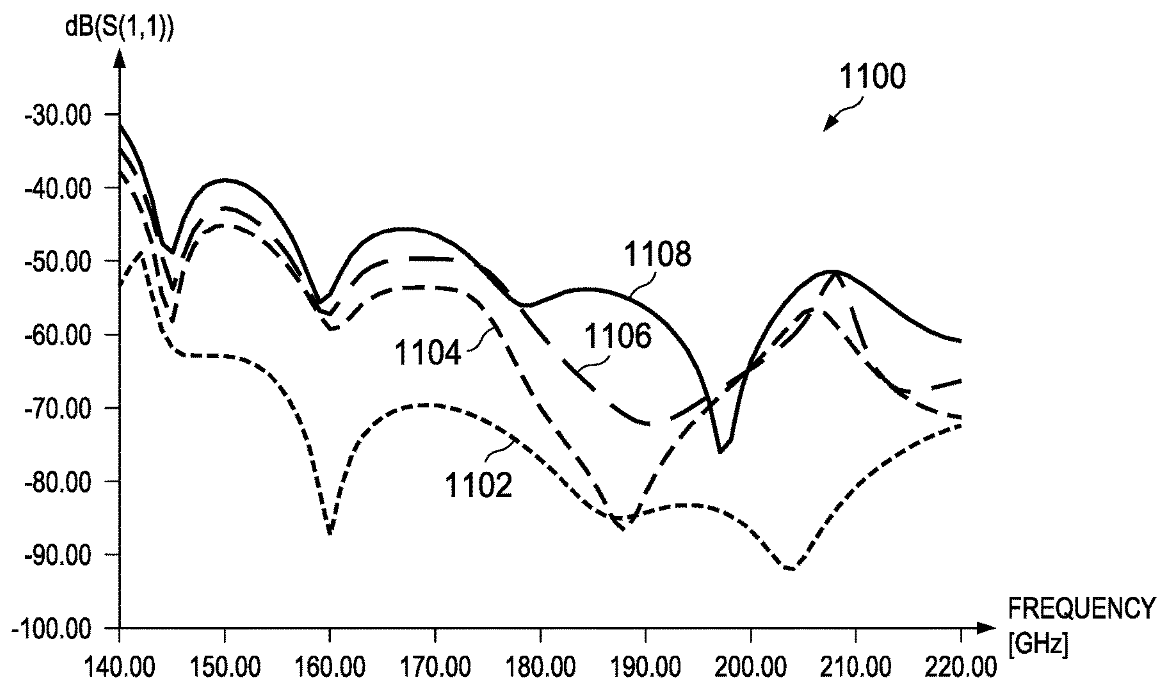
FIG. 11 is a graph of return reflected loss as a function of frequency for different sidewall to top metal gap distances in the gas cell of FIG. 9.

Referring also to FIGS. 10 and 11, the example method 100 uses anodic bonding during the processing 802 with a controlled environmental condition in the processing chamber to trap the desired gas at the proper pressure. Moreover, the thin glass film 205 is deposited above the metal 209 of the first substrate 202, and anodic bonding can still occur with minimal adverse impact to the RF performance of the cavity at the relevant high frequencies of operation. Importantly, although there is no electrical conductivity between all four walls of the metallic waveguide, perfect DC continuity is not necessary to operation of the waveguide.

A graph 1000 in FIG. 10 shows representative RF performance degradation (insertion loss) in As shown by the curves 1004, 1006 and 1008, dB as a function of operating frequency for different fabricated gap sizes. A first curve 1002 represents insertion loss performance for no gap, the and curves 1004, 1006 and 1008 respectively illustrate insertion loss as a function of frequency for 2 μm, 3 μm and 5 μm gap distances. FIG. 11 shows a graph 1100 of return reflected loss in dB as a function of frequency for different sidewall to top metal gap distances in the gas cell 201 of FIG. 9. The graph 1100 includes a first curve 1102 representing the return reflected loss for no gap, and the curves 1104, 1106 and 1108 respectively illustrate the return reflected loss for increasing gap distances G. The graphs 1000 and 1100 illustrate an acceptable trade-off between a small amount of insertion loss and return reflected loss penalty, and the low leakage sealing advantages facilitated by the use of the anodic bonding processing 802. In this regard, at relevant frequencies of interest (e.g., 180-190 GHz for H2O dipolar gas in the cavity 203), the cell 201 works well even when a layer of glass 205 isolates one of the metallic waveguides 207 from the other 209. The low-leakage fabrication processing illustrated by the example method 100, and the resulting gas cell structure 201 including the gap G facilitate chip-scale fabrication of millimeter wave atomic clocks and gas cells for other applications by the use of anodic or fusion bonding process to fabricate the cells 201.

Figure 12:
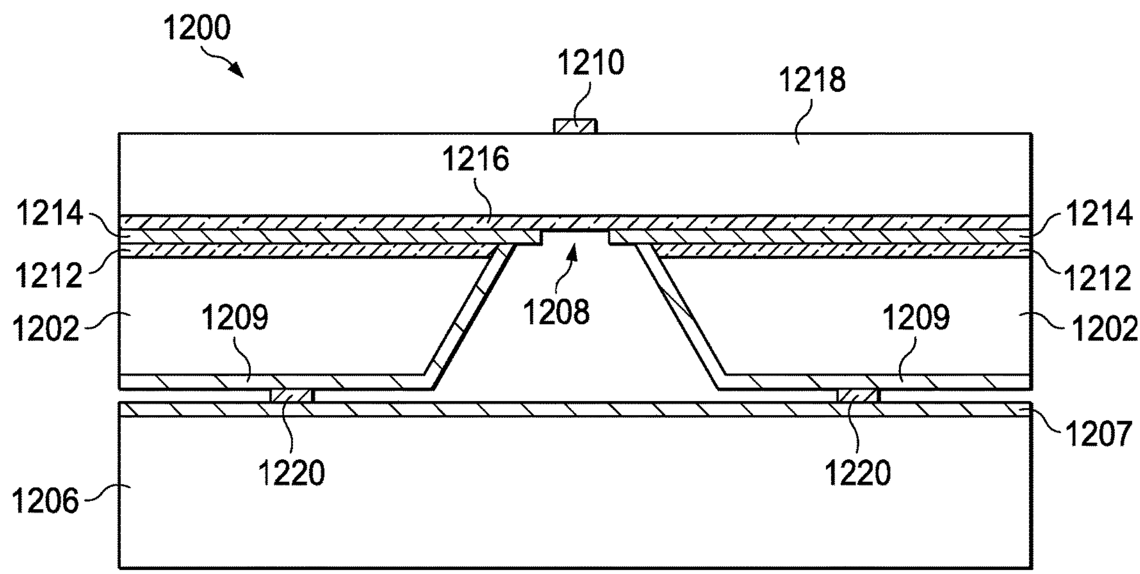
FIG. 12 is a partial side elevation view of a gas cell sealed with remelted eutectic material.

FIG. 12 illustrates a cell 1200 formed using different bonding processes, which suffers from gas cell leakage. Accordingly, the design of FIG. 12 is largely unsuitable for chip scale fabrication of gas cells with extended product life cycles. The cell 1200 includes a first substrate 1202 with a cavity formed therein, and a metal conductive layer 1209 formed on the cavity sidewalls. A glass layer 1212 is formed on an upper surface of the first substrate 1202, and is bonded to an upper substrate 1218 with a glass layer 1216 and a conductive material layer 1214 formed on the bottom thereof. An aperture 1208 is formed on the cavity-top by etching a portion of the conductive material layer 1214, and a conductive coupling structure 1210 is formed on the top side of the upper glass substrate 1218. The cell 1200 in FIG. 12 further includes a lower substrate 1206 with an upper conductive material layer 1207 formed thereon. The substrates 1202 and 1206 are bonded or joined to one another in this example using a gold or indium read melted eutectic material 1220 which provides a one-dimensional bond to seal the cavity. The above described techniques in the method 100 and the resulting gas cell structure 201 illustrated above provide distinct advantages and significantly reduced gas cell leakage compared to the design of FIG. 12.

The cell design 201 and the method 100 of the present disclosure provide a novel approach that enables advancement of rotational spectroscopy beyond the laboratory setting and into reproducible fabrication at the wafer scale level, and enable a feasible chip-scale physics cell 201 suitable for high volume, low complexity manufacturing. In particular, the disclosed gas cells 201 and the fabrication processing 100 can be used to reduce the volume of producible vacuum cells 20 1×10 to 100 compared to current state-of-the-art clocking solutions of comparable precision. Moreover, the illustrated techniques facilitate cost reduction in manufacturing of approximately 10-100× relative to current state-of-the-art clocking solutions of comparable precision. In addition, the disclosed examples facilitate a clocking stability improvement of 100-1000× compared to parts at a similar price point. In addition, the disclosed examples can be employed to significantly simplify the automated wafer handling requirements for dealing thin glass and performing hermetic wafer bonding.

Figure 13:
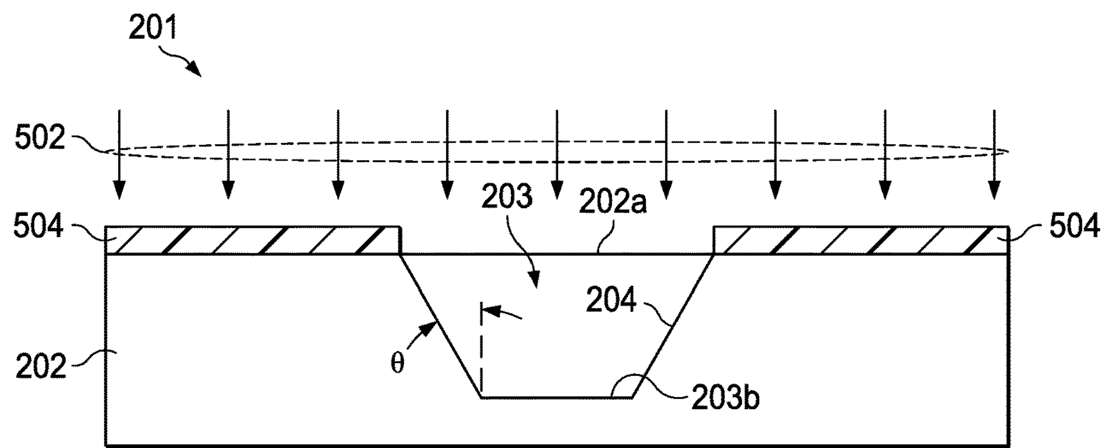
FIG. 13 is a partial side elevation view of another example first substrate undergoing an etch process to form a cavity.
Figure 14:
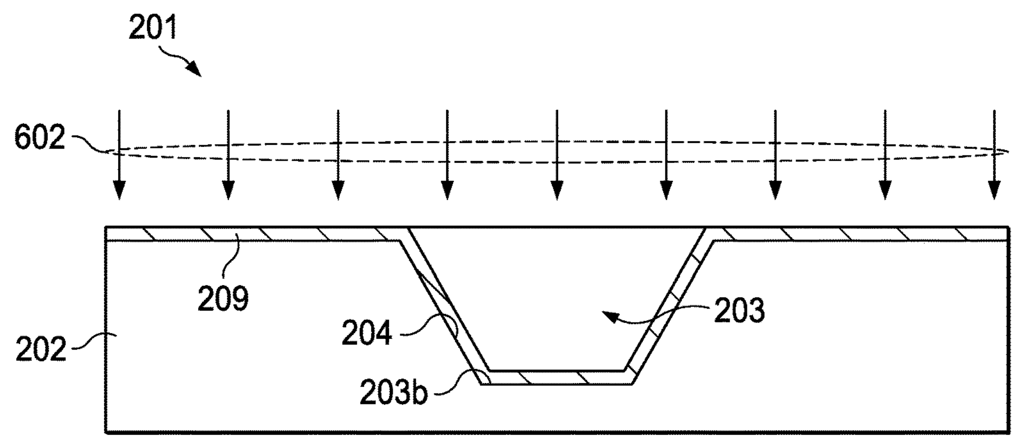
FIG. 14 is a partial side elevation view of the first substrate of FIG. 13 undergoing a deposition operation to form a conductive material on the cavity bottom and sidewalls.
Figure 15:
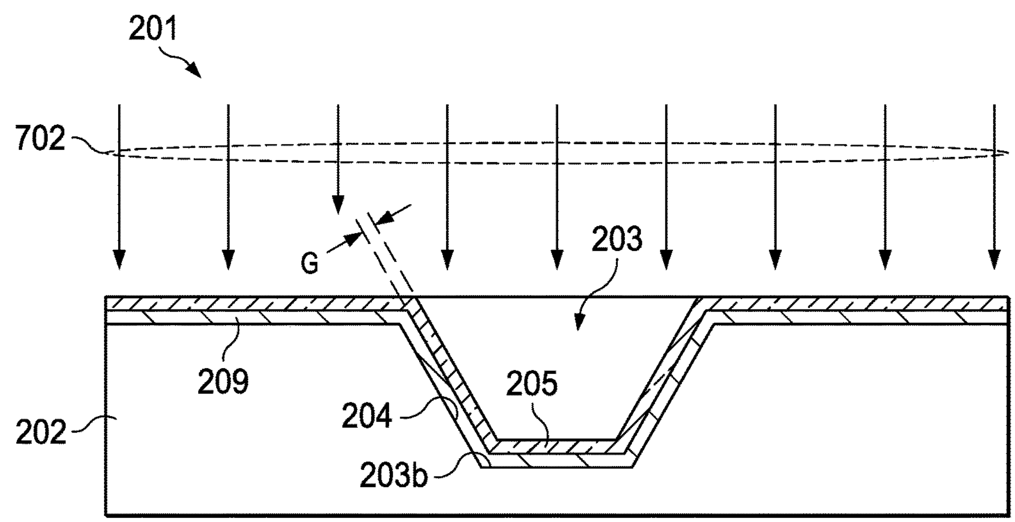
FIG. 15 is a partial side elevation view of the first substrate of FIGS. 13 and 14 undergoing a deposition operation to form a glass layer on the conductive material on the cavity bottom and sidewalls.
Figure 16:
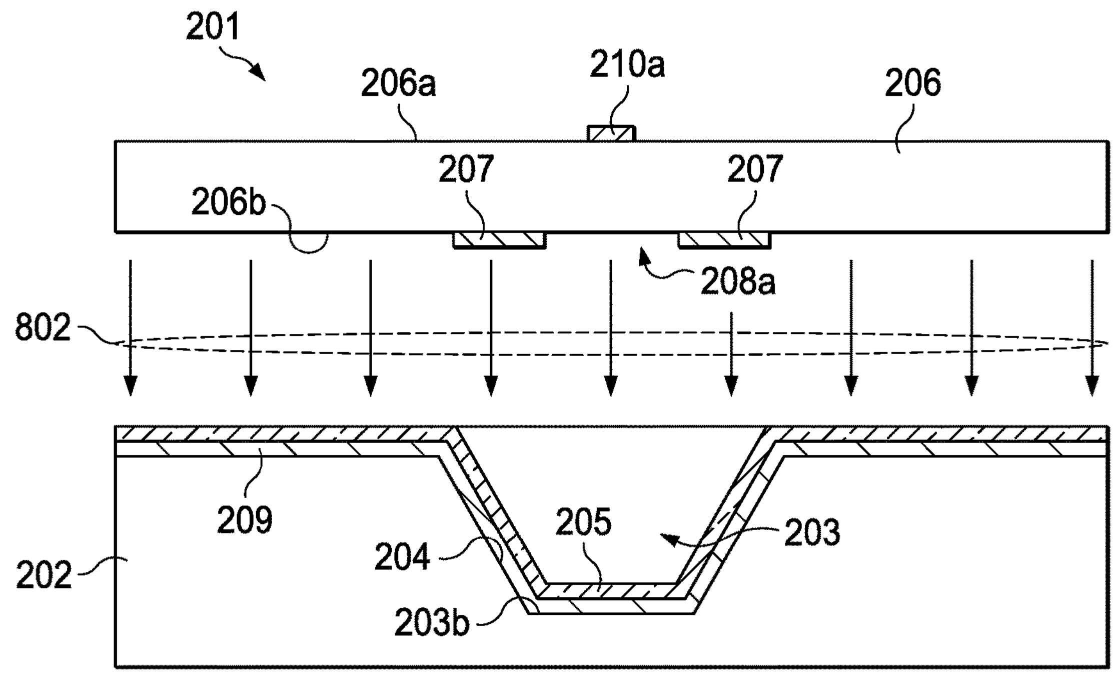
FIG. 16 is a partial side elevation view of a second substrate being bonded to a top side of the first substrate of FIGS. 13-15.
Figure 17:
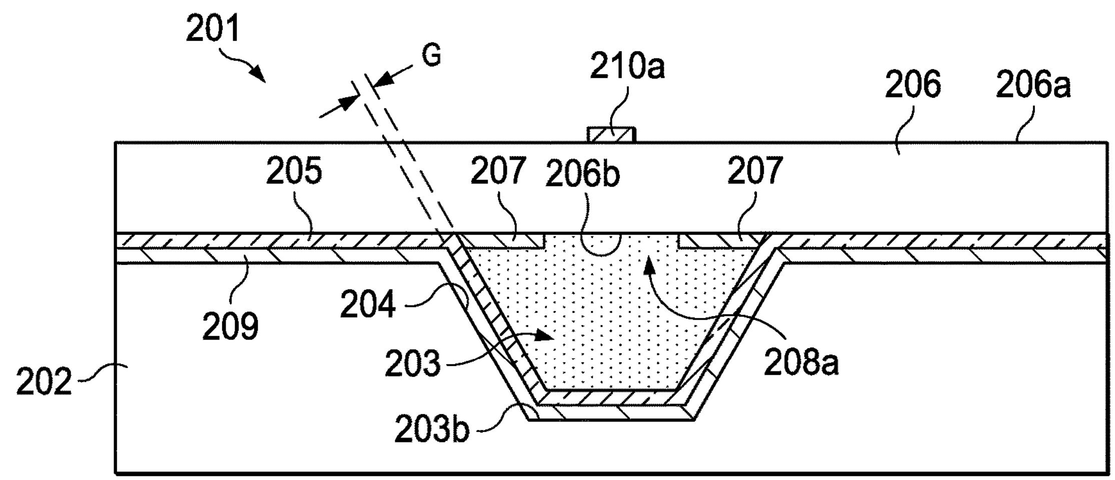
FIG. 17 is a partial sectional side elevation view of the gas cell after bonding of the first and second substrates of FIGS. 13-16.

FIGS. 13-19 show another example gas cell 201 fabricated using anodic bonding. FIG. 13 illustrates the first substrate 202 undergoing a mast etch process 502, such as described above in connection with FIG. 5, which forms a cavity 203 in the first (top) side of the substrate 202. FIG. 14 illustrates the first substrate 202 undergoing a deposition operation 602 to form a conductive material 209 on the cavity bottom and sidewalls, as described above in connection with FIG. 6. FIG. 15 shows the first substrate 202 undergoing a deposition operation 702, which forms a glass layer 205 layer on the conductive material 209 on the cavity bottom and sidewalls, as described above in connection with FIG. 7. Unlike the above example, the second substrate 206 as shown in FIG. 16 includes a second conductive material 207 formed and patterned to provide the above-described entrance and exit apertures 208, and also to remove the conductive material 207 from the lateral areas outside the prospective cavity region. The glass lower surface of the second substrate 206 is bonded using a bonding process 802 in FIG. 16 to the deposited glass material layer 205 of the first substrate 202. The bond processing 802 in this example can be as described above in connection with the bonding in FIG. 8. The bonding in FIG. 16 yields the resulting cell structure 201 shown in FIG. 17, which includes a gap G between the conductive material layers 207 and 209. As with the above example of FIGS. 1-9, the gas cell 201 in FIG. 17 advantageously employs a reliable cost-effective bonding process 802, which yields the conductivity gap G. As discussed above in connection with FIGS. 10 and 11, moreover, the gap G does not inhibit or prevent proper operation of the gas cell 201 at the desired interrogation frequencies of interest (e.g., gigahertz), and the design 201 facilitates the use of cost-effective low-leakage fabrication processing per the above-described method 100 of FIG. 1.

Figure 18:
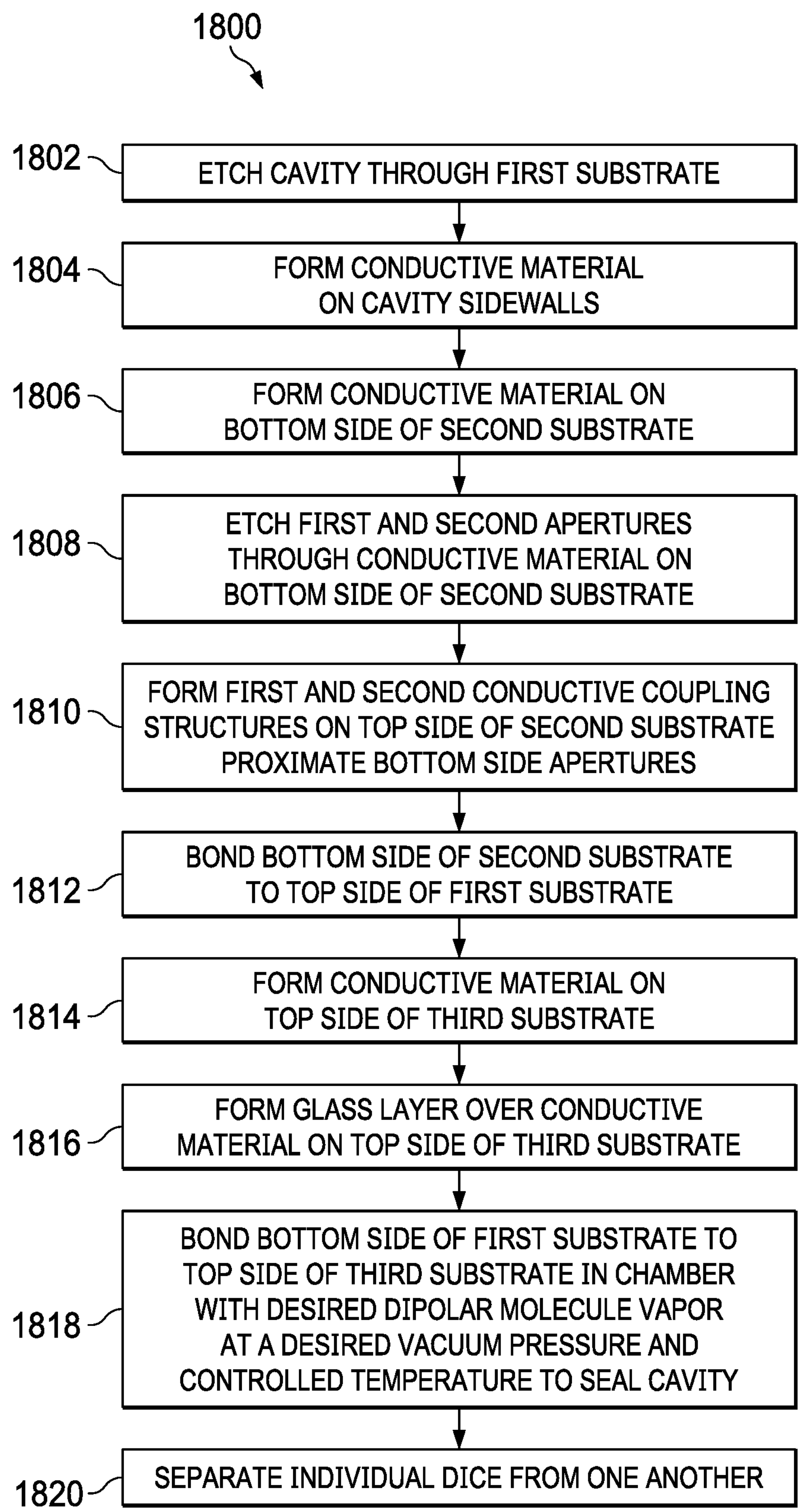
FIG. 18 is a flow diagram of another example method of fabricating a gas cell.
Figure 19:
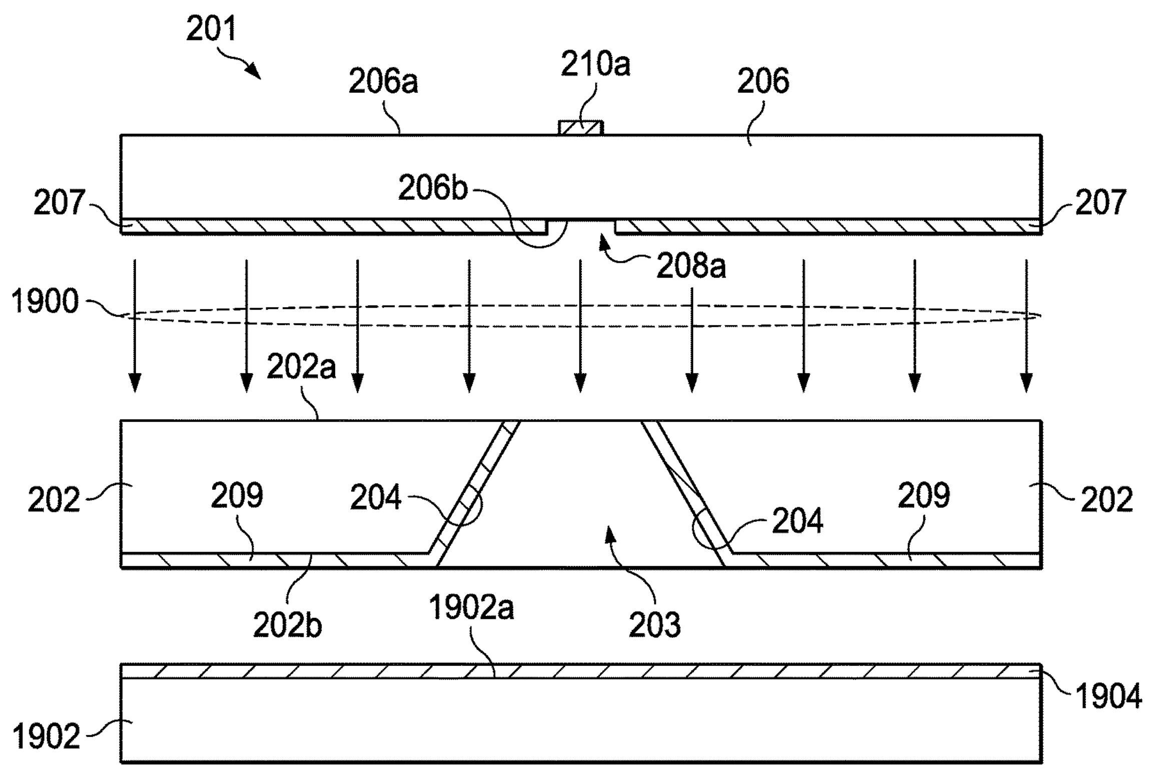
FIG. 19 is a partial side elevation view of a second substrate being bonded to a top side of a first substrate.
Figure 20:
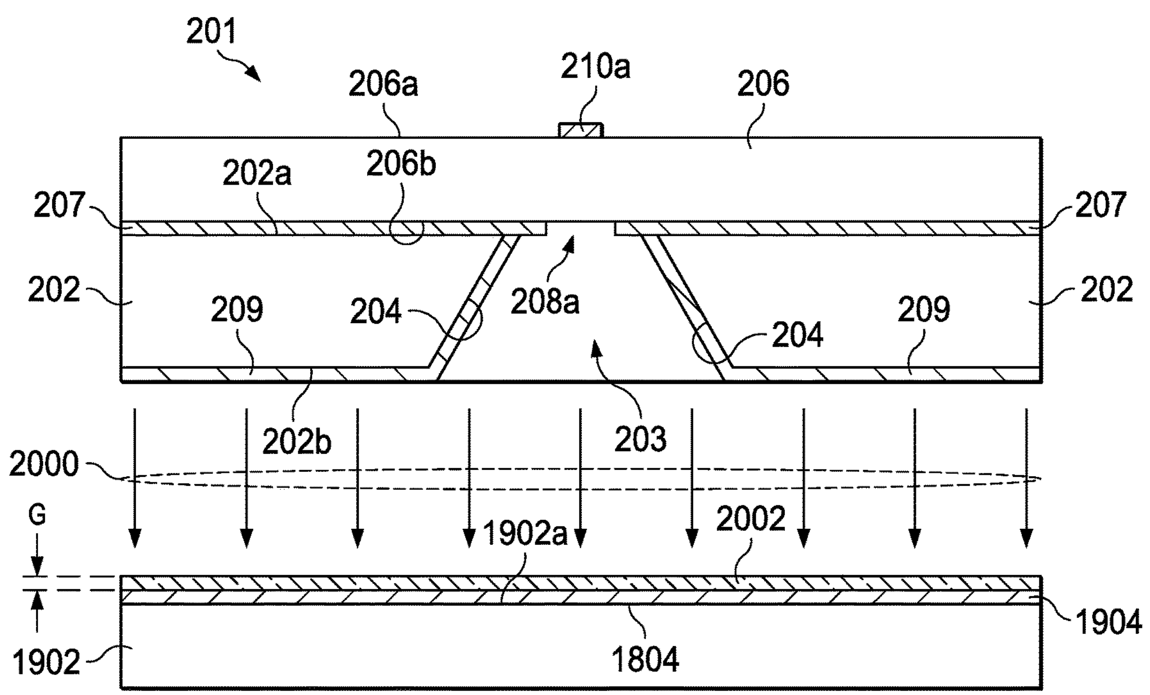
FIG. 20 is a partial side elevation view of a third substrate being bonded to a bottom side of the first substrate of FIG. 19
Figure 21:
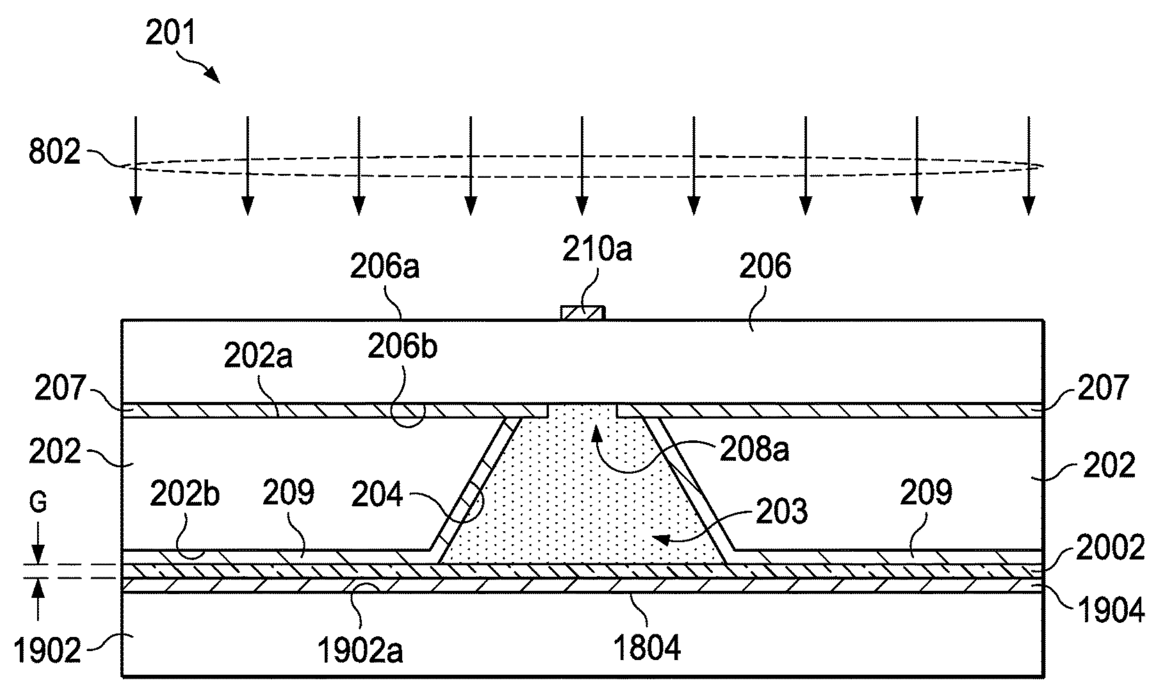
FIG. 21 is a partial sectional side elevation view of the gas cell after bonding of the first and third substrates of FIGS. 19 and 20.

FIGS. 18-21 illustrates another possible alternate implementation, including a method 1800 in FIG. 18 for fabricating a gas cell, and the resulting gas cell 201 shown in FIGS. 19-21 at various stages of fabrication. The method 1800 includes etching or otherwise forming a cavity (203) in a first substrate (202) at 1802, forming a first conductive material 209 on a sidewall 204 of the cavity 203 and on a portion of the second side 202*b* of the first substrate 202 at 1804, and forming a second conductive material (207) on the bottom side 206*b* of the second substrate 206 and 1806. The second conductive material 207 is etched at 1808 to form first and second spaced apertures 208 through the second conductive material 207 (one of which (208A) is shown in FIG. 19). At 1810, the first and second conductive coupling structures 210 are formed on the top side 206*a* of the second substrate 206.

At 1810 in FIG. 18, the bottom side 206*b* of the second substrate 206 is bonded to a portion of the first side 202*a* of the first substrate 202, for example, using an anodic bonding process 1900 in FIG. 19. A shown in FIG. 20, a portion of the bottom side 206*b* of the second substrate 206 is bonded to a portion of the first side 202*a* of the first substrate 202 at 1812 of FIG. 18. At 1814, a third conductive material 1904 is formed on a top side 1902*a* of a third (e.g., glass) substrate 1902, as shown in FIG. 19. At 1816, a glass layer 2002 is formed on the third conductive material 1904 as shown in FIG. 20, and a portion of the third conductive material 1904 on the top side 1902*a* of the third substrate 1902 is bonded at 1818 to a portion of the first conductive material 209 on the second side 202*b* of the first substrate 202 to seal the cavity 203 before the dice are separated at 1820. This provides the gas cell 201 shown in FIG. 21, where the first substrate 202 is a semiconductor structure (e.g., silicon wafer), and the second and third substrates 206 and 1902 are glass structures. In this example, the cavity 203 extends between the first side 202*a* and the second side 202*b* of the first substrate 202, and the bottom conductive material 1904 of the cavity 203 is disposed on the top surface 1902*a* of the third substrate 1902. This example provides a gap G between the bottom-side conductive material 1904 and the conductive material 209 of the cavity sidewalls, and thus does not provide DC conductivity among all the waveguide conductive surfaces. However, as discussed above in connection with FIGS. 10 and 11, the gas cell 201 in FIG. 21 provides acceptable performance as a waveguide for high frequencies of interest in use as a cell of a millimeter wave atomic clock or in other applications.

Modifications are possible in the described embodiments, and other embodiments are possible, within the scope of the claims.

The following is claimed:

1. A method of fabricating a gas cell, the method comprising:

forming a cavity in a first side of a first substrate;

forming a first conductive material on at least one sidewall and a bottom of the cavity;

forming a glass layer on the first conductive material;

forming a second conductive material on a bottom side of a second substrate;

etching the second conductive material to expose the bottom side of the second substrate to form first and second spaced apertures through the second conductive material;

forming first and second conductive coupling structures on a top side of the second substrate; and bonding a portion of the bottom side of the second substrate to a portion of the first side of the first substrate to seal the cavity.

2. The method of claim 1, wherein the first substrate is a semiconductor structure, and wherein the second substrate is a glass structure.

3. The method of claim 2, wherein bonding the second substrate to the first side of the first substrate includes performing an anodic bonding process which bonds a portion of the glass layer to a portion of the second conductive material to form a seal.

4. The method of claim 3, wherein the anodic bonding process creates a gap between the first conductive material and the second conductive material.

5. The method of claim 2, wherein bonding the second substrate to the first side of the first substrate includes bonding a portion of the glass layer to a first portion of the bottom side of the second substrate to form a seal.

6. The method of claim 5, wherein etching the second conductive material includes exposing the first portion of the bottom side of the second substrate.

7. The method of claim 5, wherein bonding the second substrate to the first side of the first substrate creates a gap between the first conductive material and the second conductive material.

8. The method of claim 1, wherein bonding the second substrate to the first side of the first substrate includes performing an anodic bonding process.

9. The method of claim 1, wherein bonding the second substrate to the first side of the first substrate creates a gap between the first conductive material and the second conductive material.

10. A method of fabricating a gas cell, the method comprising:

forming a cavity between first and second sides of a first substrate;

forming a first conductive material on a sidewall of the cavity and on a portion of the second side of the first substrate;

forming a second conductive material on a bottom side of a second substrate;

etching the second conductive material to expose the bottom side of the second substrate to form first and second spaced apertures through the second conductive material;

forming first and second conductive coupling structures on a top side of the second substrate; and bonding a portion of the bottom side of the second substrate to a portion of the first side of the first substrate;

forming a third conductive material on a top side of a third substrate;

forming a glass layer on the third conductive material; and bonding a portion of the third conductive material on the top side of the third substrate to a portion of the first conductive material on the second side of the first substrate to seal the cavity.

11. The method of claim 10, wherein the first substrate is a semiconductor structure, wherein the second substrate is a glass structure, and wherein the third substrate is a glass structure.

12. The method of claim 10, wherein bonding the portion of the third conductive material on the top side of the third substrate to the portion of the first conductive material on the second side of the first substrate includes performing an anodic bonding process which bonds the portion of the third conductive material on the top side of the third substrate to the portion of the first conductive material on the second side of the first substrate to seal the cavity.

13. The method of claim 12, wherein bonding the portion of the bottom side of the second substrate to the portion of the first side of the first substrate includes performing an anodic bonding process which bonds the portion of the bottom side of the second substrate to the portion of the first side of the first substrate.

14. The method of claim 12, wherein bonding the portion of the third conductive material on the top side of the third substrate to the portion of the first conductive material on the second side of the first substrate creates a gap between the first conductive material and the third conductive material.

15. The method of claim 10, wherein bonding the portion of the bottom side of the second substrate to the portion of the first side of the first substrate includes performing an anodic bonding process which bonds the portion of the bottom side of the second substrate to the portion of the first side of the first substrate.

16. A gas cell, comprising:

a first substrate, including a semiconductor material, a first side, a second side, a cavity formed at least partially in the first side, and a first conductive material on a sidewall of the cavity;

a second substrate, including a top side, a bottom side, first and second conductive coupling structures on the top side, a second conductive material on the bottom side, a portion of the second conductive material forming a top of the cavity and including first and second spaced apertures extending through the second conductive material;

a bottom conductive material formed on a bottom of the cavity; and a glass layer disposed on the bottom conductive material;

the first conductive material on the sidewall spaced from one of the second conductive material and the bottom conductive material.

17. The gas cell of claim 16, wherein the glass layer extends between the first conductive material on the sidewall and the second conductive material to define a gap between the first conductive material on the sidewall of the cavity and the second conductive material along the top of the cavity.

18. The gas cell of claim 17, wherein the second conductive material extends between the first side of the first substrate and the top side of the second substrate.

19. The gas cell of claim 17, further comprising a DC source to provide a DC bias voltage signal between the first conductive material and the second conductive material.

20. The gas cell of claim 16, wherein the glass layer extends between an interior of the cavity and the bottom conductive material.

21. The gas cell of claim 20, wherein the cavity extends between the first side and the second side of the first substrate, further comprising a third substrate with a top surface;

wherein the bottom conductive material is disposed on the top surface of the third substrate; and wherein the glass layer is disposed on the bottom conductive material to form the bottom of the cavity to define a gap between the first conductive material on the sidewall of the cavity and the bottom conductive material along the bottom of the cavity.

* * * * *